United States Patent
Deng et al.

(10) Patent No.: US 11,611,282 B2
(45) Date of Patent: Mar. 21, 2023

(54) SWITCHING POWER CIRCUIT FOR CHARGING A BATTERY

(71) Applicant: Silergy Semiconductor Technology (Hangzhou) LTD, Hangzhou (CN)

(72) Inventors: Jian Deng, Hangzhou (CN); Qiukai Huang, Hangzhou (CN); Chen Zhao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 133 days.

(21) Appl. No.: 17/116,196

(22) Filed: Dec. 9, 2020

(65) Prior Publication Data

US 2021/0194377 A1  Jun. 24, 2021

(30) Foreign Application Priority Data

Dec. 20, 2019  (CN) .......................... 201911322505.9

(51) Int. Cl.
*H02M 3/335* (2006.01)
*G01R 19/165* (2006.01)
*H02J 7/00* (2006.01)
*H02J 7/06* (2006.01)
*H03K 5/24* (2006.01)
*H02M 1/00* (2006.01)

(52) U.S. Cl.
CPC .. *H02M 3/33592* (2013.01); *G01R 19/16538* (2013.01); *H02J 7/007* (2013.01); *H02J 7/06* (2013.01); *H03K 5/24* (2013.01); *H02M 1/0009* (2021.05); *H02M 1/0025* (2021.05)

(58) Field of Classification Search
CPC ........... H02M 3/33592; H02M 1/0025; H02M 1/0009; G01R 19/16538; H02J 7/007; H02J 7/06; H03K 5/24
USPC ....................................................... 363/21.14
See application file for complete search history.

(56) References Cited

U.S. PATENT DOCUMENTS

| | | | |
|---|---|---|---|
| 6,005,780 A | 12/1999 | Hua | |
| 6,580,258 B2 | 6/2003 | Wilcox et al. | |
| 9,214,825 B2* | 12/2015 | Sun | ..................... H02M 3/3378 |
| 9,325,254 B2 | 4/2016 | Deng et al. | |
| 9,331,588 B2 | 5/2016 | Chen | |
| 9,459,639 B2* | 10/2016 | Kasai | ........................ G05F 1/56 |
| 9,488,680 B2 | 11/2016 | Xu | |
| 2011/0176335 A1* | 7/2011 | Li | ....................... H02M 3/3376 |
| | | | 363/21.02 |
| 2014/0078789 A1 | 3/2014 | Li et al. | |

(Continued)

*Primary Examiner* — Yemane Mehari

(57) ABSTRACT

A switching power circuit for charging a battery can include: four switches extending between two ports of a low-frequency AC input voltage and an energy storage circuit, where the energy storage circuit and a primary winding of a transformer are coupled between first and second nodes, the first node is a common node of the first and second switches, and the second node is a common node of the third and fourth switches; a rectification circuit having an input terminal coupled to a secondary winding of the transformer; a DC-DC converter having an input terminal coupled to an output terminal of the rectification circuit, and generates a charging current; and a control circuit that adjusts the charging current by controlling an operation of the DC-DC converter according to a charging requirement, in order to make an average value of the charging current meet the charging requirement.

20 Claims, 14 Drawing Sheets

(56) References Cited

U.S. PATENT DOCUMENTS

| | | |
|---|---|---|
| 2014/0239934 A1 | 8/2014 | Zhang |
| 2015/0160270 A1 | 6/2015 | Shi et al. |
| 2015/0280578 A1 | 10/2015 | Huang et al. |
| 2019/0052177 A1* | 2/2019 | Lu .......................... H02M 7/217 |

* cited by examiner

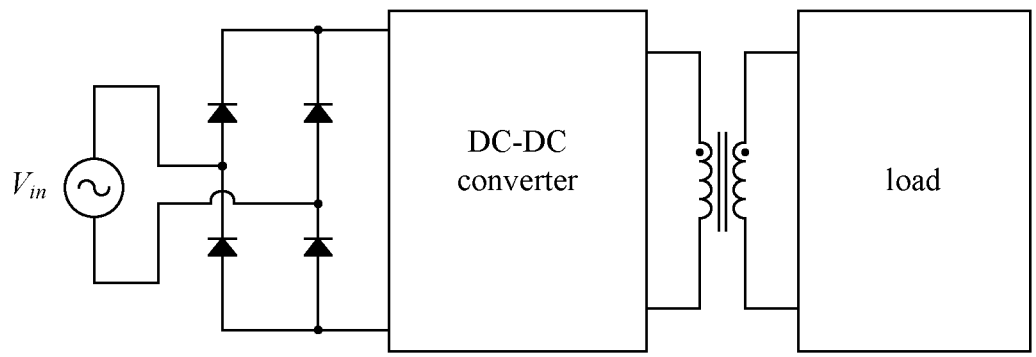
FIG. 1 (conventional)

SWITCHING POWER CIRCUIT FOR CHARGING A BATTERY

RELATED APPLICATIONS

This application claims the benefit of Chinese Patent Application No. 201911322505.9, filed on Dec. 20, 2019, which is incorporated herein by reference in its entirety.

FIELD OF THE INVENTION

The present invention generally relates to the field of power electronics, and more particularly to switching power circuitry.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

BRIEF DESCRIPTION OF THE DRAWINGS

FIG. 1 is a schematic block diagram of an example switching power circuit.

DETAILED DESCRIPTION

Figure 2:
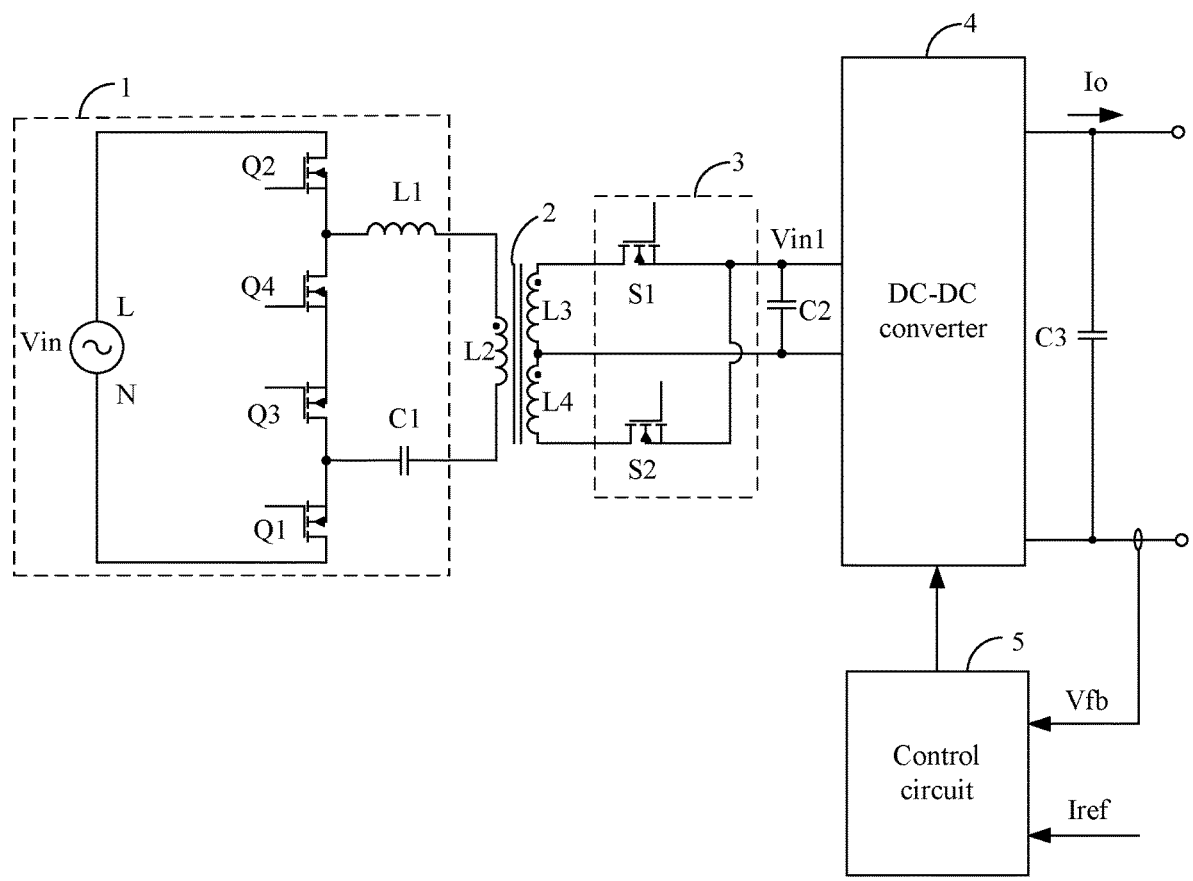
FIG. 2 is a schematic block diagram of a first example switching power circuit, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Mobile terminals (e.g., smart phones) are typically charged through a switching power circuit. Numerous semiconductor electronic devices require a switching power circuit that converts alternating current (AC) power into direct current (DC) power, in order to obtain the DC power required for operation from the AC mains network. In most cases, in order to meet the requirements of safety performance, the load side and the power side are necessarily isolated. Referring now to FIG. 1, shown is a schematic block diagram of an example switching power circuit. In this example, the switching power circuit can include a rectification bridge, a DC-DC converter, and a transformer. The rectification bridge may receive an AC input voltage, and can connect to an input terminal of the DC-DC converter. The output terminal of the DC-DC converter can be coupled to the primary winding of the transformer, the secondary winding of the transformer can be coupled to the load, and the rectification bridge can convert the received AC signal into a DC signal, and then deliver the energy to the load through the DC-DC converter and transformer. In this way, the AC input power can be converted into a stable low-voltage DC power suitable for the mobile terminal, in order to provide the power for the power management device and the battery of the mobile terminal to realize charging of the mobile terminal. However, do to the rectification bridge in the switching power supply circuit, a relatively large number of switches are required in this approach, as well as relatively large energy loss and low efficiency, particularly when the AC input voltage is low.

In one embodiment, a switching power circuit for charging a battery can include: (i) a high-frequency switching network with a series connection of four switches extending between two ports of a low-frequency AC input voltage and an energy storage circuit, where the four switches can include first, second, and third switches in series, the third switch is coupled in series between the second switch and a fourth switch, the energy storage circuit and a primary winding of a transformer are coupled between first and second nodes, the first node is a common node of the first and second switches, and the second node is a common node of the third and fourth switches; (ii) a rectification circuit having an input terminal coupled to a secondary winding of the transformer; (iii) a DC-DC converter having an input terminal coupled to an output terminal of the rectification circuit, and being configured to generate a charging current; and (iv) a control circuit configured to adjust the charging current by controlling an operation of the DC-DC converter according to a charging requirement, in order to make an average value of the charging current meet the charging requirement.

Referring now to FIG. 2, shown is a schematic block diagram of a first example switching power circuit, in accordance with embodiments of the present invention. This example switching power circuit applied to charge a battery can include high-frequency switching network 1, transformer 2, rectification circuit 3, DC-DC converter 4, and control circuit 5. In this example, high-frequency switching network 1 can include an AC input terminal for receiving low-frequency AC input voltage Vin, switches Q1, Q2, Q3, and Q4, and an energy storage circuit. First terminals of switches Q1 and Q2 can respectively be connected to two ports N and L of the AC input terminal. A second terminal of switch Q1 can connect to a first terminal of switch Q3. A second terminal of switch Q2 can connect to a first terminal of switch Q4. A second terminal of switch Q3 can connect to a second terminal of switch Q4.

The energy storage circuit and primary winding L2 of transformer 2 are connected between a first node and a second node. Here the first node is a common terminal of switches Q1 and Q3, and the second node is a common terminal of switches Q2 and Q4. An input terminal of rectification circuit 3 can connect to a secondary winding of transformer 2, and an output terminal of rectification circuit 3 can connect to an input terminal of DC-DC converter 4. DC-DC converter 4 can receive output voltage Vin1 of rectification circuit 3, and may generate charging current Io to charge the battery. In one example, DC-DC converter 4 can be configured as a resonant converter. Control circuit 5 can control an operating state of DC-DC converter 4 according to a charging requirement to adjust charging current Io, such that an average value of charging current Io meets the charging requirement.

In one example, the energy storage circuit can include inductor L1 and capacitor C1. Inductor L1, capacitor C1, and primary winding L2 can connect in series between the first and second nodes. In one example, transformer 2 can also include two secondary windings L3 and L4 connected in series. A middle terminal of the secondary winding is a common terminal of secondary windings L3 and L4. A first terminal of the secondary winding is a terminal of secondary winding L3, and a second terminal of the secondary winding is a terminal of secondary winding L4. In one example, transformer 2 can include a secondary winding with a center-taped structure that has a first, second and middle terminals. Here, the central tap is the middle terminal of the secondary winding, and the other two terminals are the first and second terminals of the secondary winding.

In one example, rectification circuit 3 can be a full-wave rectification circuit that includes rectification switches S1 and S2. A first terminal of rectification switch S1 can connect to a first terminal of secondary winding L3, and a second terminal of rectification switch S1 can be a high potential terminal of output voltage Vin1. A first terminal of rectification switch S2 can connect to a first terminal of secondary winding L4, and a second terminal of rectification switch S2 can connect to the second terminal of rectification switch S1. The middle terminal of the secondary winding can be configured as a low potential terminal of output voltage Vin1. In this example, the rectification switches can use various existing electrically controllable switch, such as a metal-oxide-semiconductor field-effect transistor (MOSFET), a bipolar-junction transistor (BJT), or insulated gate bipolar transistor (IGBT), etc., and operation states of the rectification switches can be controlled by utilizing primary control. In one example, control circuit 5 can control an operating state of DC-DC converter 4 according to sampling signal Vfb representative of charging current Io and charging reference Iref, such that an average value of charging current Io meets charging reference Iref.

Figure 3:
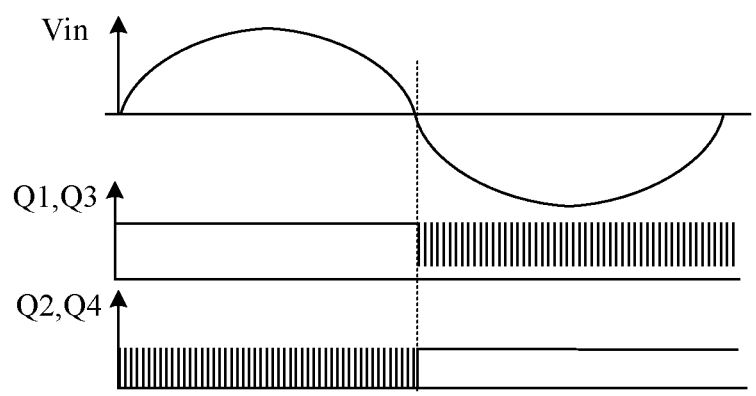
FIG. 3 is a waveform diagram of a first example operation of a high-frequency switching network, in accordance with embodiments of the present invention.

Referring now to FIG. 3, shown is a waveform diagram of a first example operation of a high-frequency switching network, in accordance with embodiments of the present invention. When low-frequency AC input voltage Vin is during a positive half cycle, that is, the voltage at terminal L is greater than the voltage at terminal N, switches Q1 and Q3 may always be turned on, and switches Q2 and Q4 can be turned on alternately in a high-frequency pulse-width modulation (PWM) mode. In this way, capacitor C1, inductor L1, and primary winding L2 may form an LLC resonant circuit, and switches Q1, Q2, Q3, and Q4 can operate in a resonant state. When low-frequency AC input voltage Vin is during a negative half cycle, that is, the voltage at terminal N is greater than the voltage at terminal L, switches Q2 and Q4 may always be turned on, and switches Q1 and Q3 can be turned on alternately in the high-frequency PWM mode. In this way, capacitor C1, inductor L1, and primary winding L2 may form an LLC resonant circuit, and switches Q1, Q2, Q3, and Q4 can operate in a resonant state, thereby realizing high-frequency chopping. The frequency of the high-frequency PWM mode is much greater than the frequency of low frequency AC input voltage Vin, and the high-frequency switching network of this example can operate at a fixed frequency.

When switch Q2 is turned on and switch Q4 is turned off, low-frequency AC input voltage Vin can charge the energy storage circuit and the primary winding, and the polarity of the voltage across the primary winding may not necessarily correspond to that of low-frequency AC input voltage Vin. For example, the polarity of the voltage across the primary winding can be consistent with or opposite to that of low-frequency AC input voltage Vin. When switch Q2 is turned off and switch Q4 is turned on, the energy storage circuit can discharge the primary winding. When switch Q1 is turned on and switch Q3 is turned off, low-frequency AC input voltage Vin can charge the energy storage circuit and the primary winding, and the polarity of the voltage across the primary winding may not necessarily correspond to that of low-frequency AC input voltage Vin. For example, the polarity of the voltage across the primary winding can be consistent with or opposite to that of low-frequency AC input voltage Vin. When switch Q1 is turned off and switch Q3 is turned on, the energy storage circuit can discharge the primary winding.

Figure 4:
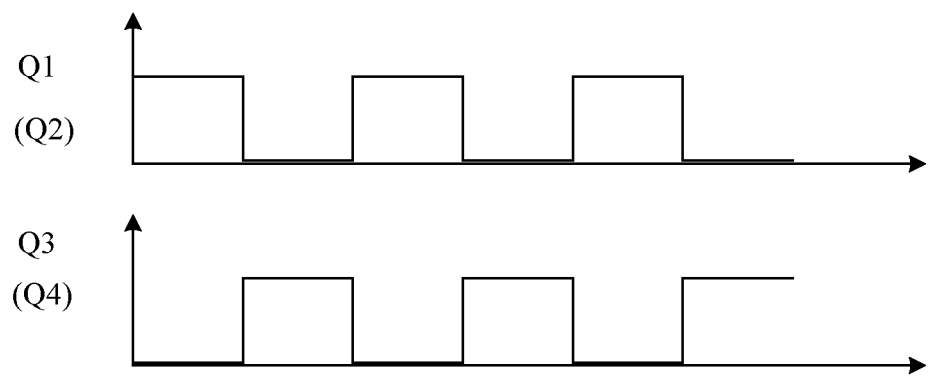
FIG. 4 is a waveform diagram of a second example operation of a high-frequency switching network.

Referring now to FIG. 4, shown is a waveform diagram of a second example operation of a high-frequency switching network, in accordance with embodiments of the present invention. When low-frequency AC input voltage Vin is during a positive half cycle, switches Q1 and Q3 may always be turned on, and switches Q2 and Q4 can be turned on alternately in a high-frequency PWM mode. When low-frequency AC input voltage Vin is during a negative half cycle, switches Q2 and Q4 may always be turned on, and switches Q1 and Q3 can be turned on alternately in the high-frequency PWM mode. It should be understood that complementary conduction of switches is a special case of alternate conduction of switches, and complementary conduction of switches has the highest efficiency. However, in order to prevent instantaneous short circuit caused by the delay of turning off the switch, a dead time can be inserted between the switching states of switches Q2 and Q4, or between the switching states of switches Q1 and Q3. In this example, the rectification switches can use various existing electrically controllable switch, such as a MOSFET, a BJT, or an IGBT.

In FIG. 2, the switching power circuit can also include capacitors C2 and C3. Capacitor C2 connected to the output terminal of rectification circuit 3 can filter an output signal of rectification circuit 3. Capacitor C3 connected the output terminal of DC-DC converter 4 can filter an output signal of DC-DC converter 4. In this example, high-frequency switch network 1, transformer 2, and rectification circuit 3 can convert an AC signal into a DC signal without a rectification bridge. This approach utilizes a lower number of switches, reduces the number of network stages and energy loss, and proves the efficiency, thereby solving the problem of large energy loss and low efficiency caused by the existence of the rectification bridge. The switching power circuit can be applied for charging the battery, and the operating state of DC-DC converter 4 can be controlled according to charging reference Iref to adjust charging current Io, such that an average value of charging current Io meets charging reference Iref. In this particular example, the output current of DC-DC converter 4 is in a continuous form.

Since AC power (e.g., main power is 50 Hz, 220V) generates electrical energy intermittently, most equipment may not directly use AC power under normal circumstances. In order to provide an uninterrupted power supply, the switching power supply circuit may need to be equipped with an electrolytic capacitor (e.g., capacitor C3 in FIG. 2) for energy storage, such that when the AC power is at a valley, the energy storage of the electrolytic capacitor may be required to maintain a stable power supply. However, the electrolytic capacitor may generally be relatively large and easily damaged, which can make the switching power supply circuit relatively large and with a relatively short service life. When the switching power supply circuit charges the battery of the mobile terminal, and the battery supplies power for the mobile terminal, the continuity of power supply can be guaranteed by the battery. Also, the battery can be regarded as a capacitive load, such that the switching power supply circuit may not need to supply continuous and stable DC power when charging the battery, and the output current of the switching power supply circuit can be discontinuous.

As opposed to constant voltage and constant current charging approaches, the battery in certain embodiments can be charged by utilizing a pulsating current, which can reduce the lithium evolution phenomenon of the lithium battery and the probability and intensity of the arc of the contact of the charging interface, which is advantageous for the charger. For example, this can improve the service life of the battery and USB, reduce the polarization effect of the battery, improve the charging speed, reduce the heating of the battery, and ensure the safety and reliability of the battery. In addition, since the output current of the switching power supply is a pulsating current, the battery may not need to be equipped with an electrolytic capacitor, which can not only realize the simplification and miniaturization of the battery, but also greatly reduce the costs.

Figure 5:
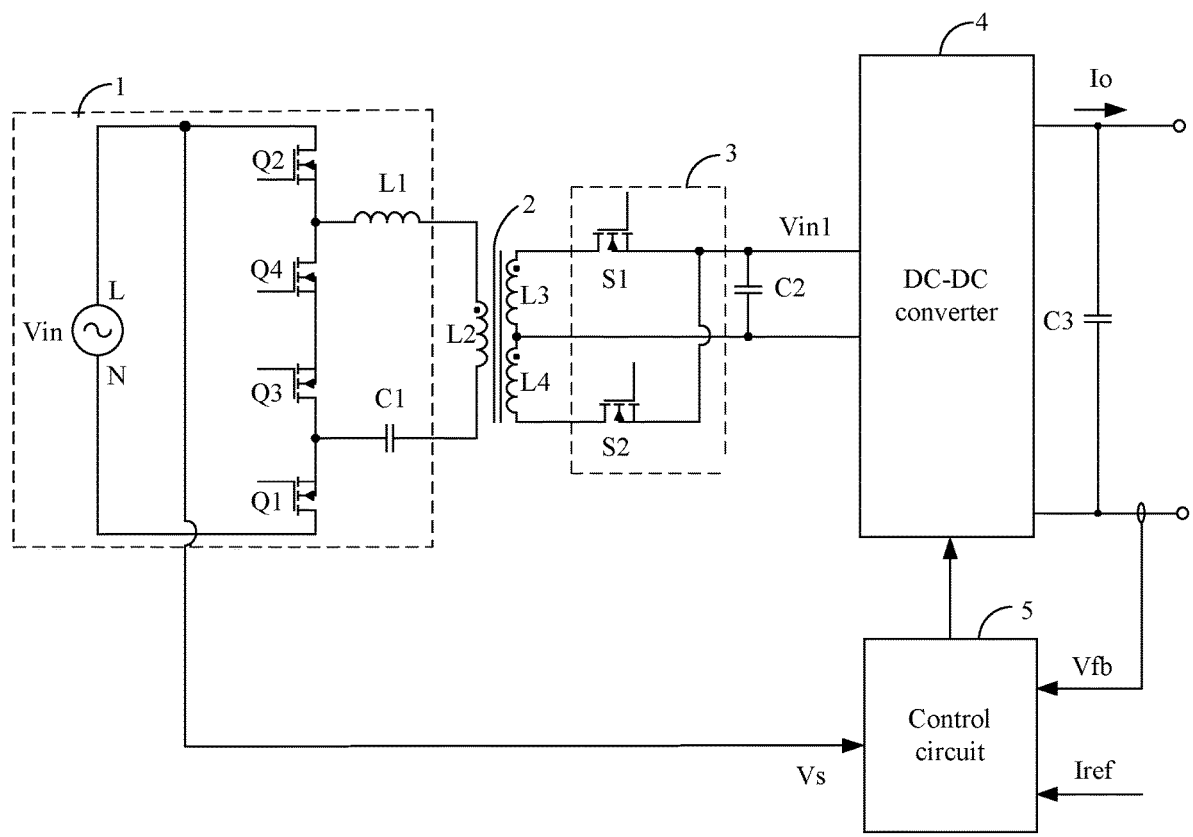
FIG. 5 is a schematic block diagram of a second example switching power circuit, in accordance with embodiments of the present invention.

Referring now to FIG. 5, shown is a schematic block diagram of a second example switching power circuit, in accordance with embodiments of the present invention. High-frequency switching network 1, transformer 2, rectification circuit 3, and DC-DC converter 4 in FIG. 5 are substantially the same as that in FIG. 2. In this particular example, control circuit 5 can control an operating state of DC-DC converter 4 according to charging reference Iref to adjust charging current Io, and charging current Io is intermittent. In one example, charging current Io is zero at least when the absolute value of low-frequency AC input voltage Vin is lower than predetermined threshold Vth, and the average value of charging current Io meets charging reference Iref. For example, when the absolute value of low-frequency AC input voltage Vin is lower than predetermined threshold Vth, control circuit 5 can control DC-DC converter 4 not to operate, such that charging current Io is zero. When the absolute value of low-frequency AC input voltage Vin is higher than predetermined threshold Vth, control circuit 5 can control DC-DC converter 4 to operate such that charging current Io is not zero. Thus, charging current Io can be intermittent. Further, since the output voltage of rectification circuit 3 is positively correlated with low-frequency AC input voltage Vin, charging current Io can be intermittent by comparing the output voltage of rectification circuit 3 against a second predetermined threshold. For example, when the output voltage of rectification circuit 3 is lower than the second predetermined threshold, control circuit 5 can control DC-DC converter 4 not to operate such that charging current Io is zero. When the output voltage of rectification circuit 3 is higher than the second predetermined threshold, control circuit 5 can control DC-DC converter 4 to operate such that charging current Io is not zero.

In one example, a value of charging current Io that is not zero is fixed, and the waveform of charging current Io may be a square wave. In another example, a value of charging current Io that is not zero is variable, and the waveform of the charging current Io may be a triangular wave or a sine wave. In one example, when the absolute value of low-frequency AC input voltage Vin is higher than predetermined threshold Vth, control circuit 5 can adjust an operating frequency of DC-DC converter 4 to control charging current Io, and DC-DC converter 4 can operate with a fixed duty cycle at the adjusted operating frequency. In one example, the frequency of charging current Io is twice the frequency of low-frequency AC input voltage Vin, or the frequency of charging current Io is about twice the frequency of low-frequency AC input voltage Vin.

In this example, DC-DC converter 4 may be a resonant converter (e.g., a half-bridge LLC resonant circuit, an LCC circuit, etc.). In one example, control circuit 5 can control the operating state of DC-DC converter 4 to generate charging current Io that is intermittent according to sampling signal Vs of low-frequency AC input voltage Vin. For example, when the absolute value of low-frequency AC input voltage Vin is lower than predetermined threshold Vth, control circuit 5 can control DC-DC converter 4 not to operate, such that charging current Io is zero. When the absolute value of low-frequency AC input voltage Vin is higher than predetermined threshold Vth, control circuit 5 can control DC-DC converter 4 to operate such that charging current Io is not zero. Thus, charging current Io can be intermittent.

Figure 6:
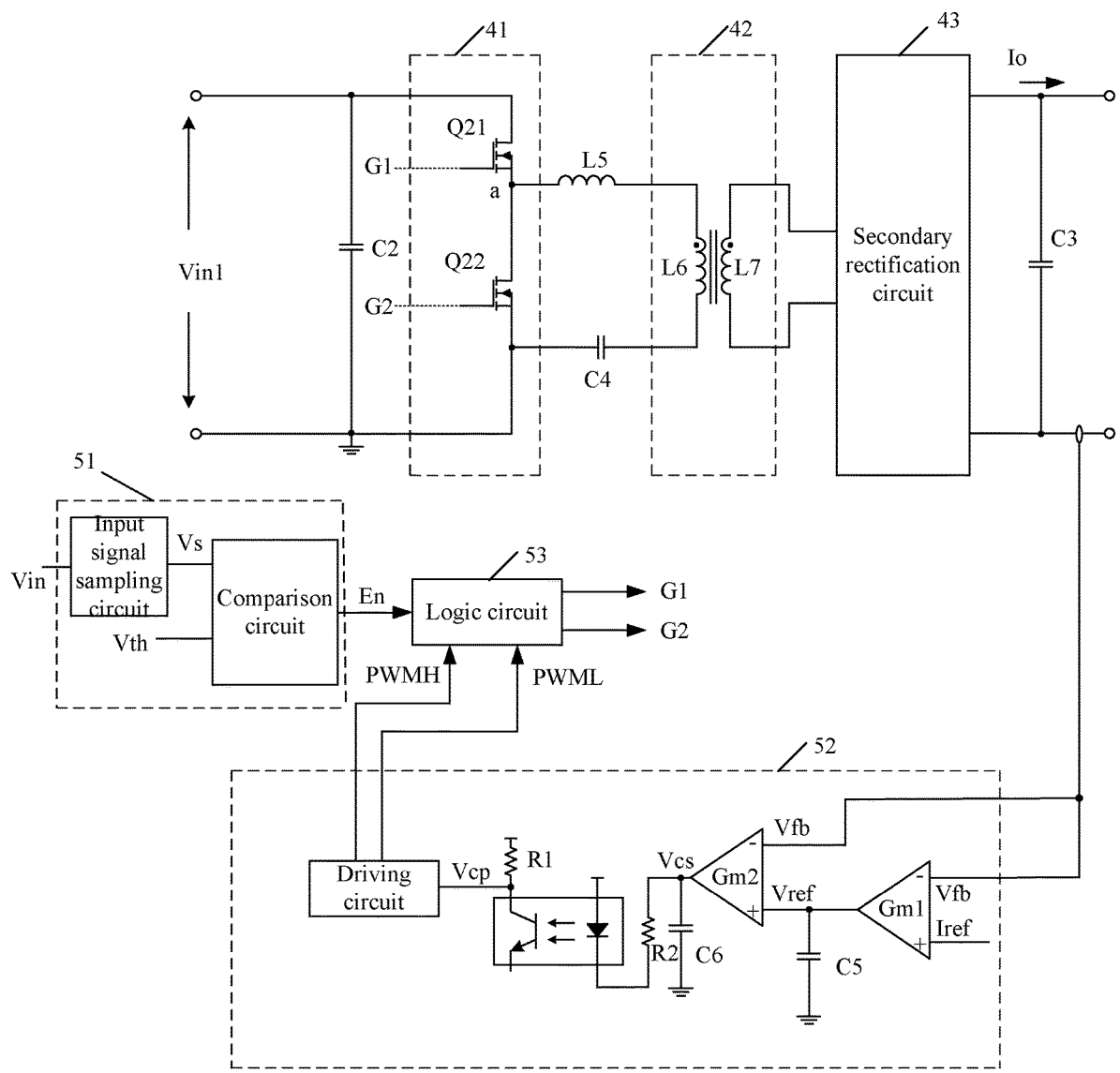
FIG. 6 is a schematic block diagram of a first example control circuit, in accordance with embodiments of the present invention.

Referring now to FIG. 6, shown is a schematic block diagram of a first example control circuit, in accordance with embodiments of the present invention. In this example, DC-DC converter 4 can be configured as a half-bridge LLC resonant circuit, and may include switching circuit 41, transformer 42, secondary rectification circuit 43, resonant inductor L5, and resonant capacitor C4. In this example, switching circuit 41 can include switches Q21 and Q22, and a common terminal of switches Q21 and Q22 is "a." Switch Q21 can connect between an output terminal of rectification circuit 3 and common terminal a. Switch Q22 can connect between common terminal a and the ground terminal. Switches Q21 and Q22 may be controlled to be turned on or off by control signals G1 and G2, respectively.

In one example, when switch Q21 is turned on and switch Q22 is turned off, the half-bridge LLC resonant circuit can connect to the output terminal of rectification circuit 3, and input voltage Vin1 can supply power to the rechargeable battery and charge the energy storage element in the half-bridge LLC resonant circuit. When switch Q21 is turned off and switch Q22 is turned on, the energy storage element in the half-bridge LLC resonant circuit may be discharged to supply power to the rechargeable battery. Capacitor C2 can connect to the output terminal of rectification circuit 3, and may filter an output voltage of rectification circuit 3. Transformer 42 can include primary winding L6 and secondary winding L7. Resonance inductor L5 can connect between common terminal a and one terminal of primary winding L6. Resonance capacitor C4 can connect between the other terminal of primary winding L6 and the ground terminal.

Resonance inductor L5, primary winding L6, and resonant capacitor C4 can be connected in series to form an LLC resonant circuit. Secondary side rectification circuit 43 can connect to secondary winding L7, an induced alternating current power of the secondary side may be rectified by the secondary side rectification circuit 43, and charging current Io can be provided to charge the battery. Further, the LLC resonant circuit may adopt a fixed duty cycle control, and adjust charging current Io by adjusting the operating frequency (switching frequency). In this way, under different input voltages, the duty cycle of the LLC resonant circuit can be maintained to be constant, and the switching frequency of the LLC resonant converter can be adjusted, in order to adjust the average value of charging current Io to meet the charging requirements.

In one example, control circuit 5 can adjust the operating frequency of DC-DC converter 4, in order to adjust charging current Io. Control circuit 5 can include control signal generation circuits 51 and 52, and logic circuit 53. Control signal generating circuit 51 can generate control signal En according to AC input voltage Vin and predetermined threshold Vth. Control signal generating circuit 52 can generate control signals PWMH and PWML according to the charging requirement and the charging current Io generated by DC-DC converter 4. Logic circuit 53 can adjust charging current Io according to control signal En and control signals PWMH and PWML. Further, logic circuit 53 can, in response to control signal En being active, control DC-DC converter 4 to operate with a fixed duty cycle at the operating frequency according to control signals PWMH and PWML. In response to control signal En being inactive, DC-DC converter 4 can be controlled not to operate.

In one example, control signal generation circuit 51 can include an input signal sampling circuit and a comparison circuit. The input signal sampling circuit can sample AC input signal Vin to obtain input voltage sampling signal Vs. The input terminals of the comparison circuit can receive input voltage sampling signal Vs and predetermined threshold Vth, respectively, and control signal En can be generated by comparing absolute value Vs' of input voltage sampling signal Vs against predetermined threshold Vth. Further, control signal En is an enable signal, and in response to absolute value Vs' of input voltage sampling signal Vs being greater than predetermined threshold Vth, control signal En can be at a high level. In response to absolute value Vs' of input voltage sampling signal Vs being less than predetermined threshold Vth, control signal En can be at a low level. It should be understood that control signal generating circuit 51 may be implemented in any suitable way in order to generate control/enable signal En.

In one example, control signal generating circuit 52 can include error amplifier Gm1, error amplifier Gm2, a compensation circuit, and a driving circuit. Error amplifier Gm1 can compare output current sampling signal Vfb against charging reference Iref to obtain error signal Vref. Error amplifier Gm2 can compare output current sampling signal Vfb against error signal Vref to obtain error signal Vcs. The compensation circuit can generate compensation signal Vcp according to error signal Vcs. The driving circuit can generate control signals PWMH and PWML according to compensation signal Vcp.

Further, a non-inverting input terminal of error amplifier Gm1 can receive charging reference Iref, and an inverting input terminal of error amplifier Gm1 can receive output current sampling signal Vfb. Here, output current sampling signal Vfb is a voltage signal, which can characterize charging current Io, and charging reference Iref can characterize the charging requirement and the average current required when the battery is charged. As a result, an output signal of error amplifier Gm1 can represent the difference between charging current Io and a required charging current, thereby forming an average current loop to control the average value of charging current Io to approach charging reference Iref.

Control signal generating circuit 52 can also include capacitor C5, which can connect between an output terminal of error amplifier Gm1 and the ground terminal, and can convert a current signal generated by error amplifier Gm1 into a voltage signal (e.g., error signal Vref). Taking error signal Vref as a reference signal, a non-inverting input terminal of error amplifier Gm2 can receive error signal Vref, an inverting input terminal of error amplifier Gm2 can receive output current sampling signal Vfb, and error signal Vcs can be generated by comparing output current sampling signal Vfb against error signal Vref. Thus, an instantaneous current loop can be formed to control the instantaneous value of charging current Io by adjusting the operating frequency of DC-DC converter 4.

Control signal generating circuit 52 can also include capacitor C6, which can connect between an output terminal of error amplifier Gm2 and the ground terminal, and may convert a current signal generated by error amplifier Gm2 into voltage signal Vcs. In one example, the compensation circuit can include resistors R1 and R2, and an optocoupler for generating compensation signal Vcp according to error signal Vcs. In one example, the driving circuit can generate control signals PWMH and PWML according to compensation signal Vcp. For example, the driving circuit can generate control signals PWMH and PWML by comparing compensation signal Vcp against ramp signal Vsaw.

In one example, logic circuit 53 can adjust charging current Io according to control signal En and control signals PWMH and PWML. Further, in response to control signal En being at a low level, logic circuit 53 may not activate control signals G1 and G2. In response to control signal En being at a high level, logic circuit 53 can generate control signals G1 and G2 according to control signals PWMH and PWML to control switching circuit 41 to operate with a fixed duty cycle at the operating frequency. For example, in response to control signal En being at a low level, output control signals G1 and G2 may both be at a low level. In response to control signal En being at a high level, control signals PWMH and PWML can be generated as control signals G1 and G2. In one example, if control circuit 5 in FIG. 6 removes control signal generation circuit 51, and only control signal generation circuit 52 generates control signals PWMH and PWML to control the switching state of DC-DC converter 4, charging current Io can meet the charging requirement, and may be continuous.

Figure 7:
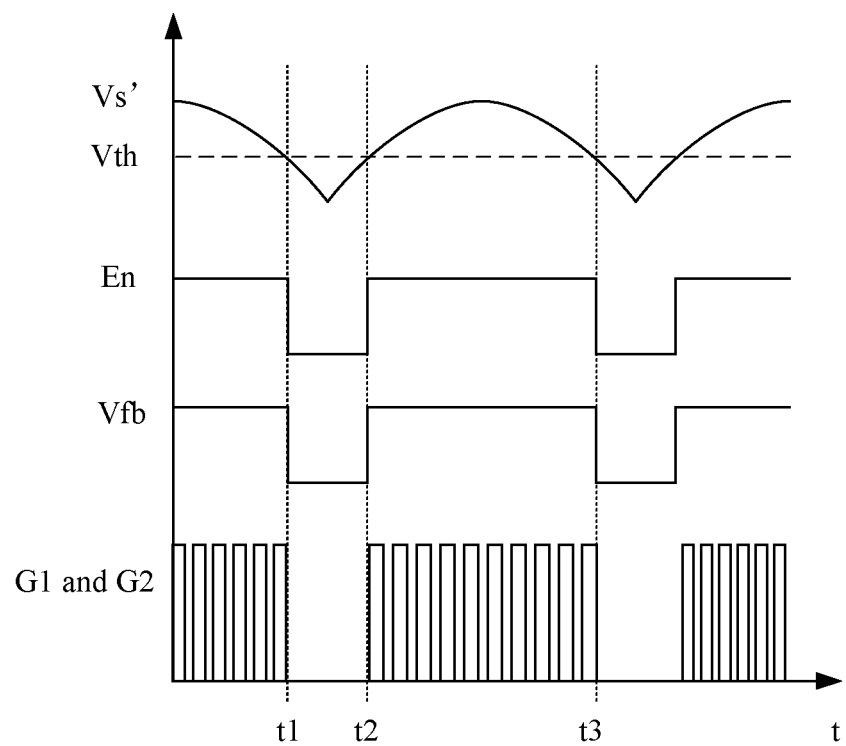
FIG. 7 is a waveform diagram of a first example operation of a switching power circuit, in accordance with embodiments of the present invention.

Referring now to FIG. 7, shown is a waveform diagram of a first example operation of a switching power circuit, in accordance with embodiments of the present invention. In this particular example, absolute value Vs' of input voltage sampling signal Vs, predetermined threshold Vth, control signal En, output current sampling signal Vfb, and control signals G1 and G2 are shown in the ordinate, and the coordinate is time t. At time t1, absolute value Vs' of input voltage sampling signal Vs drops to be equal to predetermined threshold Vth, control signal En can be switched to a low level, and logic circuit 53 may not generate control signals G1 and G2. In this way, switching circuit 41 does not operate (is disabled), that is, switches Q21 and Q22 are turned off, such that charging current Io is zero (or close to zero), and output current sampling signal Vfb is zero.

At time t2, absolute value Vs' of input voltage sampling signal Vs rises to be equal to predetermined threshold Vth, control signal En can be switched to a high level to enable, and logic circuit 53 can generate control signals G1 and G2 to control switching circuit 41 to operate. In this way, switches Q21 and Q22 are turned on alternately, such that charging current Io is higher and output current sampling signal Vfb is higher. At time t3, absolute value Vs' of input voltage sampling signal Vs drops again to be equal to predetermined threshold Vth, and so on. In this example, switches Q21 and Q22 can be turned off for a period of time during each cycle, thereby controlling charging current Io to be zero. During another period of time in each cycle, switches Q21 and Q22 are turned on and off alternately, thereby controlling charging current Io to be higher. Therefore, charging current Io may be a pulsating current.

Figure 8:
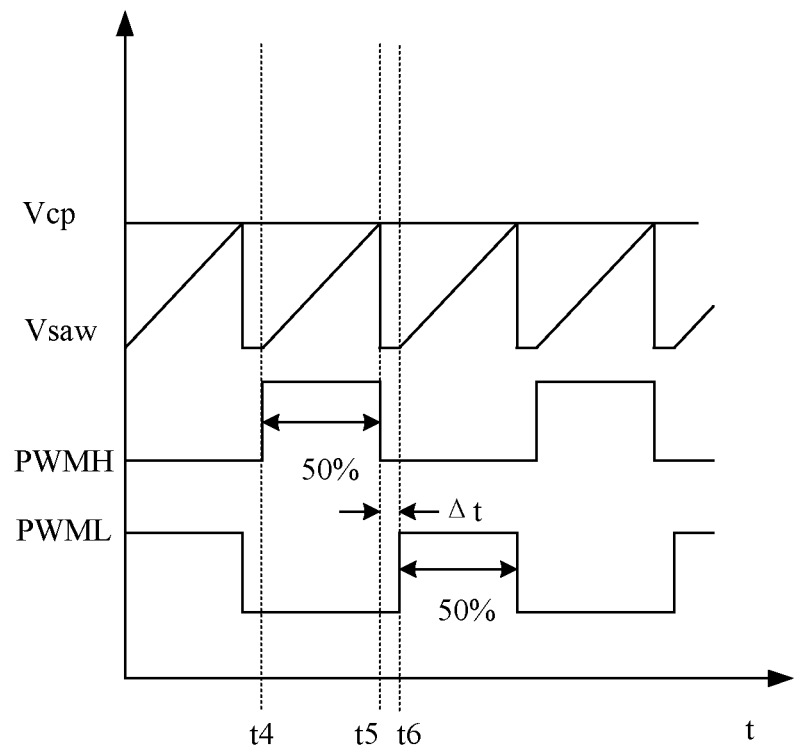
FIG. 8 is a waveform diagram of example operation of a driving circuit, in accordance with embodiments of the present invention.

Referring now to FIG. 8, shown is a waveform diagram of example operation of a driving circuit, in accordance with embodiments of the present invention. In this particular example, compensation signal Vcp, ramp signal Vsaw and control signals PWMH and PWML are shown in the ordinate during a period when switches Q21 and Q22 are turned on alternately, and the coordinate is time t. At time t4, ramp signal Vsaw begins to rise, control signal PWMH can be switched to a high level, and control signal PWML may remain at a low level. At time t5, ramp signal Vsaw may rise to be equal to compensation signal Vcp, control signal PWMH can be switched to a low level, and control signal PWML can remain at a low level. After reading time Δt (e.g., dead time), that is, at time t6, ramp signal Vsaw begins to rise, control signal PWMH remains at low level, and control signal PWML can be switched to a high level. In such a cycle, the duty cycles of control signals PWMH and PWML may always be 50% (ignoring the dead time), and DC-DC converter 4 can be controlled to operate with a fixed duty cycle at the operating frequency. Therefore, the operating frequency of DC-DC converter 4 can be adjusted according to the difference between charging reference Iref and output current sampling signal Vfb, and DC-DC converter 4 can be operated with a fixed duty cycle at the operating frequency, in order to adjust the average value of charging current Io to meet the charging requirements for charging the battery.

Figure 9:
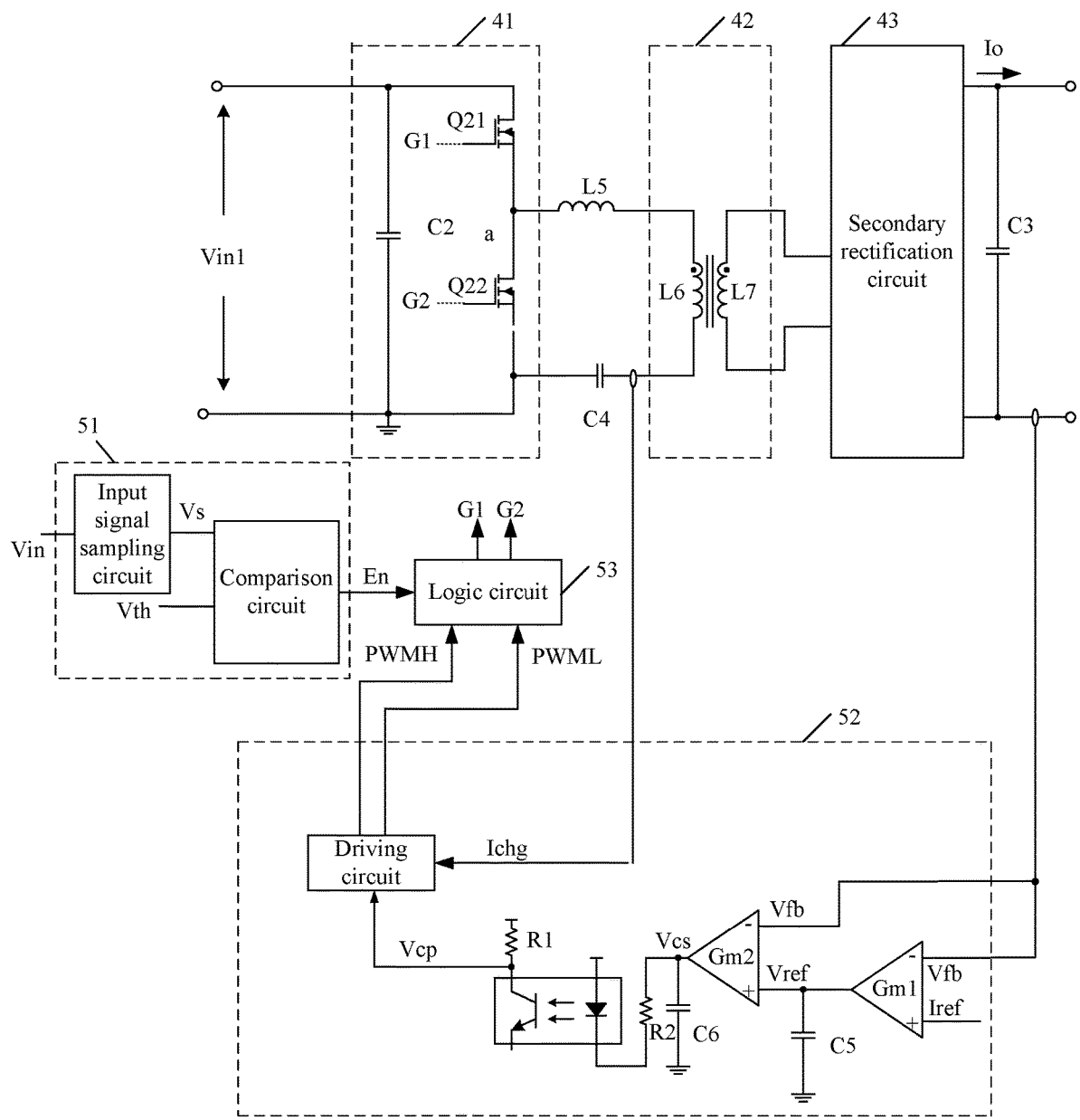
FIG. 9 is a schematic block diagram of a second example control circuit, in accordance with embodiments of the present invention.

Referring now to FIG. 9, shown is a schematic block diagram of a second example control circuit, in accordance with embodiments of the present invention. The structure of DC-DC converter 4 and control circuit 5 in FIG. 9 is similar to that in FIG. 6. In this particular example, the driving circuit can receive resonance current sampling signal Ichg, and may generate control signals PWMH and PWML according to resonance current sampling signal Ichg and compensation signal Vcp.

Figure 10:
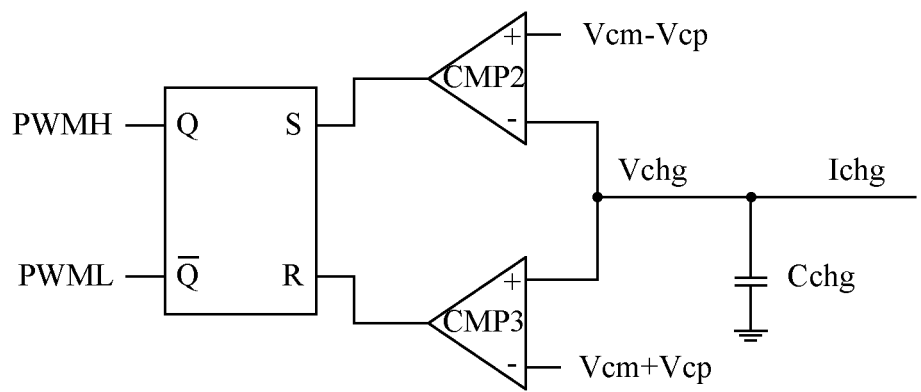
FIG. 10 is a schematic block diagram of a first example driving circuit, in accordance with embodiments of the present invention.

Referring now to FIG. 10, shown is a schematic block diagram of a first example driving circuit, in accordance with embodiments of the present invention. This example driving circuit can include comparators CMP2 and CMP3, and an RS flip-flop. In one example, the driving circuit can sample a voltage across resonance capacitor C3 directly to generate voltage signal Vchg, and may obtain common mode voltage signal Vcm. An inverting input terminal of comparator CMP2 and a non-inverting input terminal of comparator CMP3 can receive voltage signal Vchg. A non-inverting input terminal of comparator CMP2 can receive a difference between common mode voltage signal Vcm and compensation signal Vcp, and an inverting input terminal of comparator CMP3 can receive the sum of common mode voltage signal Vcm and compensation signal Vcp. Logic circuit 53 can adjust charging current Io according to control signal En and control signals PWMH and PWML. In another example, the driving circuit can further include capacitor Cchg for converting resonant current Ichg into voltage signal Vchg. Here, capacitor Cchg is not an electrolytic capacitor.

In this example, in response to control signal En being at a low level, logic circuit 53 may not generate control signals G1, and G2. In response to control signal En being at a high level, logic circuit 53 can be enabled to generate control signals G1 and G2 to control switching circuit 41 to operate with a fixed duty cycle at the operating frequency. It should be understood that if control circuit 5 in FIG. 9 removes control signal generation circuit 51, and only control signal generation circuit 52 generates control signals PWMH and PWML to control the switching state of DC-DC converter 4, charging current Io can meet the charging requirement and can be continuous.

Figure 11:
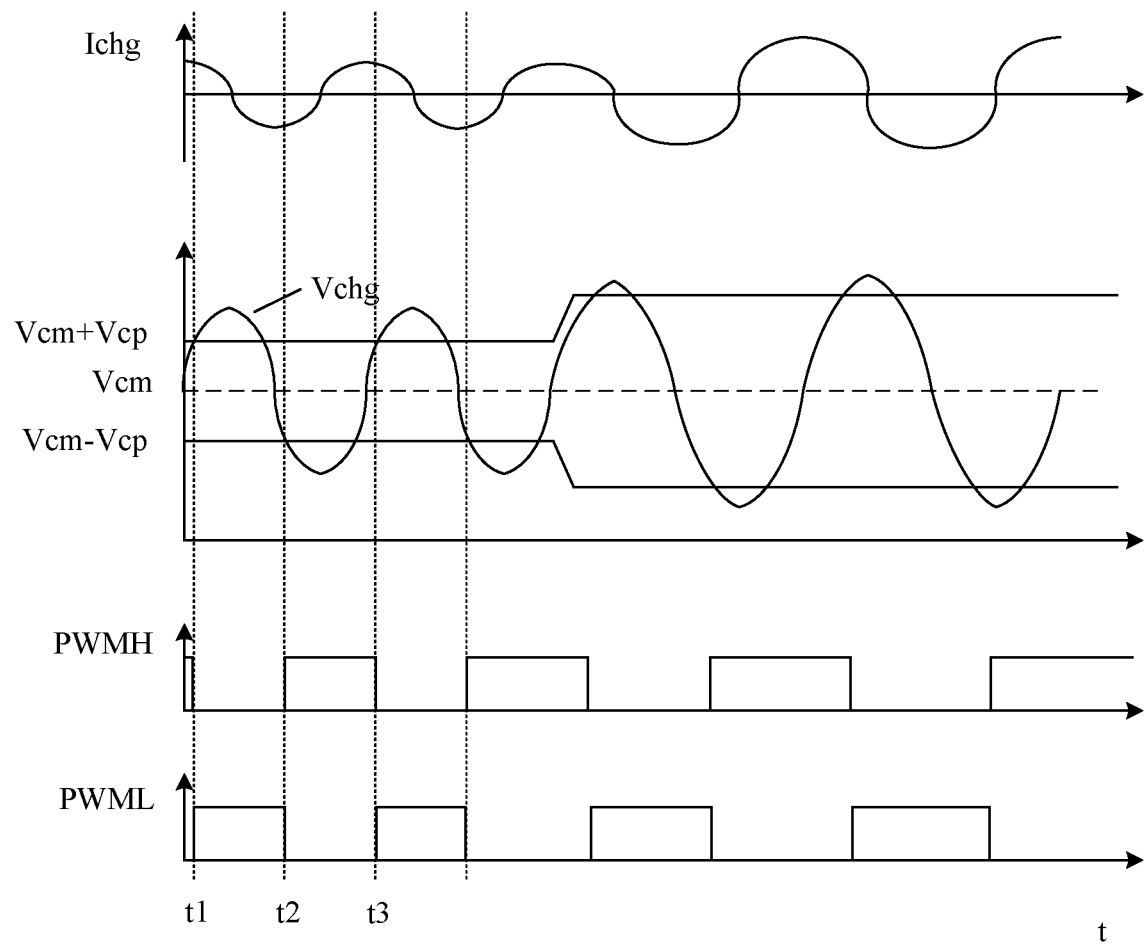
FIG. 11 is a waveform diagram of a second example operation of a switching power circuit, in accordance with embodiments of the present invention.

Referring now to FIG. 11, shown is a waveform diagram of a second example operation of a switching power circuit, in accordance with embodiments of the present invention. In this particular example, resonant current sampling signal Ichg, voltage signal Vchg, and control signals PWMH and PWML are shown in the ordinate during a period when switches Q21 and Q22 are turned on and off alternately, and the coordinate is time t. At time t1, voltage signal Vchg rises to equal to the sum of common mode voltage signal Vcm and compensation signal Vcp, an output signal of comparator CMP3 is high after time t1, that is, a reset signal of the RS flip-flop is active. In this way, control signal PWMH can be switched to be a low level, and control signal PWML can be switched to be a high level. At time t2, voltage signal Vchg drops to equal to the difference between common mode voltage signal Vcm and compensation signal Vcp, an output signal of comparator CMP2 is high after time t2, that is, a set signal of the RS flip-flop is active. In this way, control signal PWMH can be switched to be a high level, and control signal PWML can be switched to be a low level. In such a cycle, the duty cycles of control signals PWMH/PWML are always 50%, and DC-DC converter 4 can be controlled to operate with a fixed duty cycle at the operating frequency.

Figure 12:
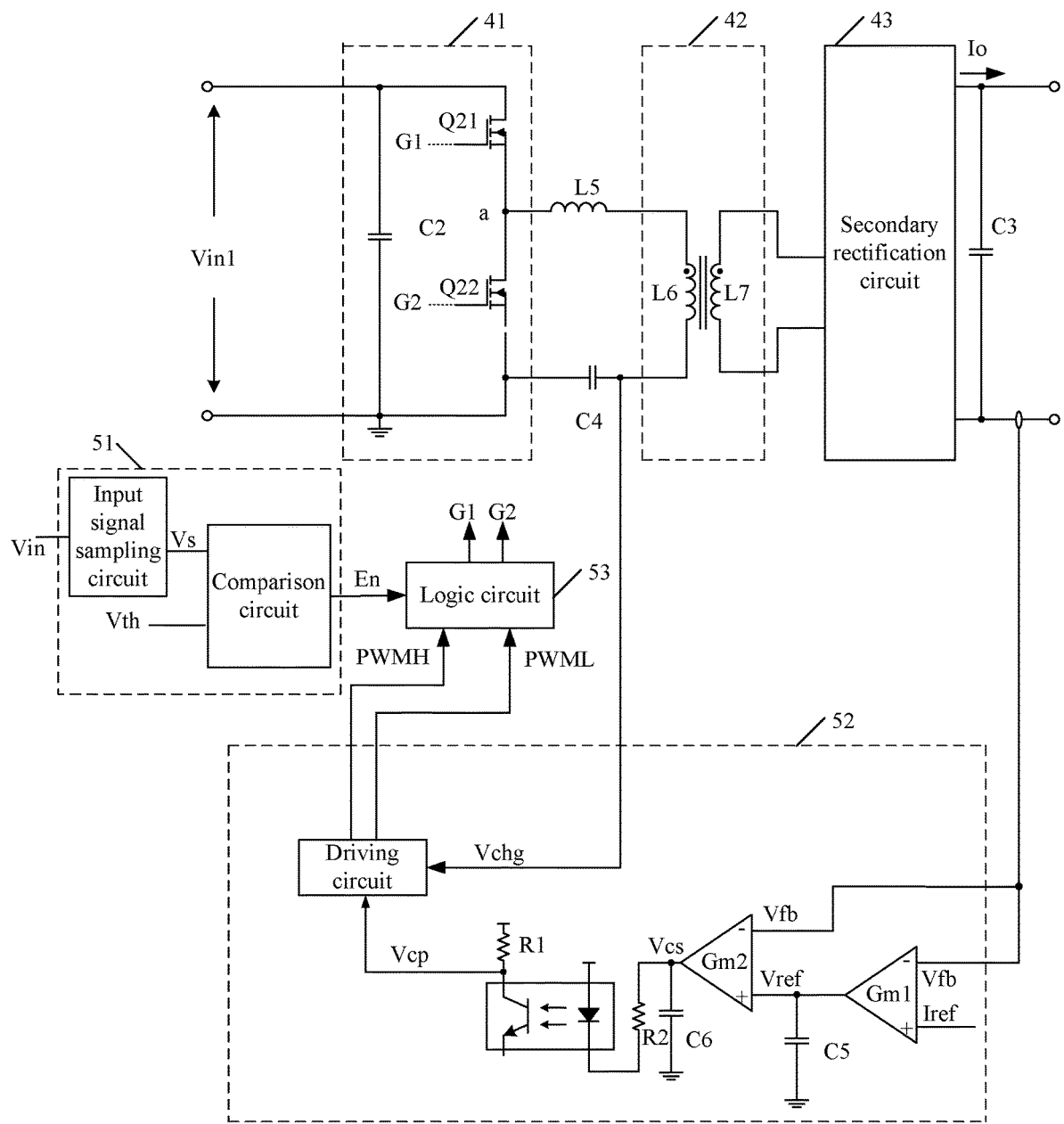
FIG. 12 is a schematic block diagram of a third example control circuit, in accordance with embodiments of the present invention.

Referring now to FIG. 12, shown is a schematic block diagram of a third example control circuit, in accordance with embodiments of the present invention. The structure of DC-DC converter 4 and control circuit 5 in FIG. 12 is similar to that in FIG. 9. In this particular example, the driving circuit can directly sample the resonant capacitor voltage to generate voltage signal Vchg, and generate control signals PWMH and PWML according to voltage signal Vchg and compensation signal Vcp. In addition, a resonant current can be integrated by capacitor Cchg to generate voltage signal Vchg.

Figure 13:
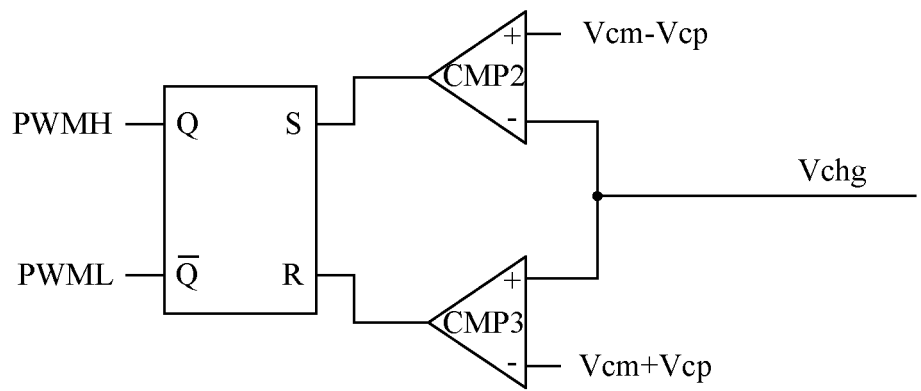
FIG. 13 is a schematic block diagram of a second example driving circuit, in accordance with embodiments of the present invention.

Referring now to FIG. 13, shown is a schematic block diagram of a second example driving circuit, in accordance with embodiments of the present invention. This example driving circuit can include comparators CMP2 and CMP3, and an RS flip-flop. An inverting input terminal of comparator CMP2 and a non-inverting input terminal of comparator CMP3 can receive voltage signal Vchg. A non-inverting input terminal of comparator CMP2 can receive a difference between common mode voltage signal Vcm and compensation signal Vcp, and an inverting input terminal of comparator CMP3 can receive the sum of common mode voltage signal Vcm and compensation signal Vcp. Logic circuit 53 can adjust charging current Io according to control signal En and control signals PWMH and PWML. In this example, in response to control signal En being at a low level, logic circuit 53 may not generate control signals G1 and G2. In response to control signal En being at a high level to enable, logic circuit 53 can generate control signals G1 and G2 to control switching circuit 41 to operate with a fixed duty cycle at the operating frequency. It should be understood that if control circuit 5 in FIG. 12 removes control signal generation circuit 51, and only control signal generation circuit 52 generates control signals PWMH and PWML to control the switching state of DC-DC converter 4, charging current Io can meet the charging requirement, and can be continuous.

Figure 14:
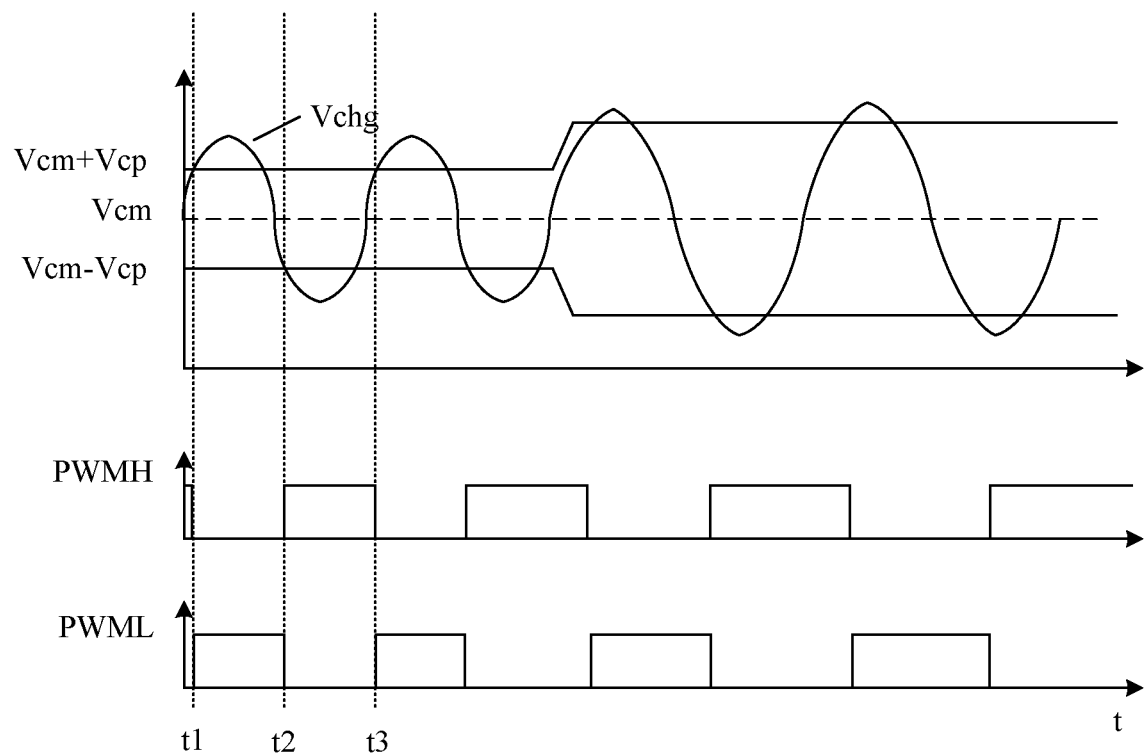
FIG. 14 is a waveform diagram of a third example operation of a switching power circuit, in accordance with embodiments of the present invention.

Referring now to FIG. 14, shown is a waveform diagram of a third example operation of a switching power circuit, in accordance with embodiments of the present invention. In this particular example, voltage signal Vchg, and control signals PWMH and PWML are shown in the ordinate during a period when switches Q21 and Q22 are turned on alternately, and the coordinate is time t. At time t1, voltage signal Vchg rises to equal to the sum of common mode voltage signal Vcm and compensation signal Vcp, an output signal of comparator CMP3 is high, that is, a reset signal of the RS flip-flop is active. In this way, control signal PWMH can be switched to be a low level, and control signal PWML can be switched to be a high level. At time t2, voltage signal Vchg drops to equal to the difference between common mode voltage signal Vcm and compensation signal Vcp, an output signal of comparator CMP2 is high, that is, a set signal of the RS flip-flop is active. In this way, control signal PWMH can be switched to be a high level, and control signal PWML can be switched to be a low level. In such a cycle, the duty cycles of the control signals PWMH and PWML may always be 50%, and DC-DC converter 4 can be controlled to operate with a fixed duty cycle at the operating frequency.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A switching power circuit for charging a battery, the switching power circuit comprising:
    a) a high-frequency switching network comprising a series connection of four switches that directly receives a low-frequency AC input voltage and an energy storage circuit, wherein the four switches comprises first, second, third, and fourth switches coupled in series, the energy storage circuit and a primary winding of a transformer are coupled between first and second nodes, the first node is a common node of the first and second switches, and the second node is a common node of the third and fourth switches;
    b) a rectification circuit having an input terminal coupled to a secondary winding of the transformer;
    c) a DC-DC converter having an input terminal coupled to an output terminal of the rectification circuit, and being configured to generate a charging current; and
    d) a control circuit configured to adjust the charging current by controlling an operation of the DC-DC converter according to a charging requirement, in order to make an average value of the charging current meet the charging requirement.

2. The switching power circuit of claim 1, wherein the energy storage module comprises a first capacitor and a first inductor coupled in series with the primary winding between the first and second nodes.

3. The switching power circuit of claim 1, wherein the high-frequency switching network operates at an LLC resonant state.

4. The switching power circuit of claim 1, wherein:
    a) during a positive half cycle of the low-frequency AC input voltage, the first and third switches remain on, and the second and fourth switches are alternately turned on in a high-frequency PWM mode; and
    b) during a negative half cycle of the low-frequency AC input voltage, the first and fourth switches remain on, and the first and third switches are alternately turned on in a high-frequency PWM mode.

5. The switching power circuit of claim 1, wherein the control circuit comprises a second control signal generation circuit configured to generate a second control signal according to the charging current and the charging requirement, in order to adjust the charging current.

6. A switching power circuit for charging a battery, the switching power circuit comprising:
    a) a high-frequency switching network comprising a series connection of four switches extending between two ports of a low-frequency AC input voltage and an energy storage circuit, wherein the four switches comprises first, second, third, and fourth switches coupled in series, the energy storage circuit and a primary winding of a transformer are coupled between first and second nodes, the first node is a common node of the first and second switches, and the second node is a common node of the third and fourth switches;
    b) a rectification circuit having an input terminal coupled to a secondary winding of the transformer;
    c) a DC-DC converter having an input terminal coupled to an output terminal of the rectification circuit, and being configured to generate a charging current; and
    d) a control circuit configured to adjust the charging current by controlling operation of the DC-DC converter according to a charging requirement, in order to make an average value of the charging current meet the charging requirement,
    e) wherein the control circuit is configured to adjust the charging current by controlling the operation of the DC-DC converter according to the charging requirement, in order to make the charging current to be intermittent, and to be zero at least when an absolute value of the low-frequency AC input voltage is lower than a predetermined threshold.

7. The switching power circuit of claim 6, wherein a frequency of the charging current is about twice as greater as a frequency of the AC input voltage.

8. The switching power circuit of claim 6, wherein a value of the charging current is fixed in an interval where the charging current is not equal to zero.

9. The switching power circuit of claim 6, wherein a value of the charging current is variable in an interval where the charging current is not equal to zero.

10. The switching power circuit of claim 6, wherein the DC-DC converter is configured to be a resonant converter, and the control circuit is configured to adjust an operating frequency of the DC-DC converter, in order to adjust the charging current.

11. The switching power circuit of claim 10, wherein the DC-DC converter is configured to operate with a fixed duty cycle at the operating frequency.

12. The switching power circuit of claim 6, wherein the control circuit comprises:
   a) a first control signal generation circuit configured to generate a first control signal according to the AC input voltage and the predetermined threshold;
   b) a second control signal generation circuit configured to generate a second control signal according to the charging requirement and the charging current;
   c) a logic circuit configured to adjust the charging current according to the first and second control signals; and
   d) wherein the logic circuit is configured to control the DC-DC converter to operate with a fixed duty cycle according to the second control signal in response to the first control signal being active, and to disable the DC-DC converter in response to the first control signal being inactive.

13. The switching power circuit of claim 12, wherein the first control signal generation circuit comprises a comparator configured to generate the first control signal by comparing a sampling signal of the AC input voltage against the predetermined threshold.

14. The switching power circuit of claim 5, wherein the second control signal generation circuit comprises:
   a) a first error amplifier configured to generate a first error signal according to a sampling signal of the charging current and a current reference signal, wherein the current reference signal represents the charging requirement;
   b) a second error amplifier configured to generate a second error signal according to the sampling signal of the charging current and the first error signal;
   c) a compensation circuit configured to generate a compensation signal according to the second error signal; and
   d) a drive circuit configured to generate the second control signal according to the compensation signal.

15. The switching power circuit of claim 14, wherein the DC-DC converter is configured to be a resonant converter, and the drive circuit is configured to generate the second control signal according to the compensation signal and a sampling signal of a resonance current.

16. The switching power circuit of claim 15, wherein the drive circuit comprises:
   a) a second comparator configured to generate a set signal according to the sampling signal of the resonance current and the compensation signal;
   b) a third comparator configured to generate a reset signal according to the sampling signal of the resonance current and the compensation signal; and
   c) a flip-flop configured to generate the second control signal according to the set signal and the reset signal.

17. The switching power circuit of claim 14, wherein the DC-DC converter is configured to be a resonant converter, and the drive circuit is configured to generate the second control signal according to the compensation signal and a sampling signal of a resonance voltage.

18. The switching power circuit of claim 17, wherein the drive circuit comprises:
   a) a second comparator configured to generate a set signal according to the sampling signal of the resonance voltage and the compensation signal;
   b) a third comparator configured to generate a reset signal according to the sampling signal of the resonance voltage and the compensation signal; and
   c) a flip-flop configured to generate the second control signal according to the set signal and the reset signal.

19. The switching power circuit of claim 1, wherein the rectification circuit is configured to be a full-wave rectification circuit.

20. The switching power circuit of claim 1, wherein the AC input voltage is directly received by the high-frequency switching network without being rectified.

* * * * *